(12) United States Patent
Rico (10) Patent No.: US 9,497,885 B2
(45) Date of Patent: Nov. 15, 2016

(54) PASSIVE VENTILATION FOR OUTDOOR ELECTRICAL ENCLOSURES

(75) Inventor: Gustavo Cortes Rico, Duluth, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 1291 days.

(21) Appl. No.: 12/559,600

(22) Filed: Sep. 15, 2009

(65) Prior Publication Data

US 2010/0075590 A1    Mar. 25, 2010

Related U.S. Application Data

(60) Provisional application No. 61/099,280, filed on Sep. 23, 2008.

(51) Int. Cl.
*F24F 13/20* (2006.01)
*H05K 7/20* (2006.01)

(52) U.S. Cl.
CPC ................. *H05K 7/20127* (2013.01)

(58) Field of Classification Search
CPC ............ H05K 5/0213; H05K 7/20127
USPC ............. 454/184, 250, 339, 347, 366, 367; 361/690, 692, 695
See application file for complete search history.

(56) References Cited

U.S. PATENT DOCUMENTS

| | | | | |
|---|---|---|---|---|
| 3,587,908 A * | 6/1971 | Nickel | ................... | H01F 27/06 174/16.1 |
| 3,654,850 A * | 4/1972 | Berkus | ................... | F23L 17/02 454/115 |
| 4,005,253 A * | 1/1977 | Walter | ................... | H01F 27/06 174/16.1 |
| 4,609,126 A * | 9/1986 | Janda | ................... | H02B 7/06 174/16.1 |
| 5,323,454 A | 6/1994 | Shay et al. | | |
| 5,371,543 A * | 12/1994 | Anderson | ................... | 348/270 |
| 5,697,840 A * | 12/1997 | Bainbridge | ........ | H05K 7/20172 361/645 |
| 6,129,628 A * | 10/2000 | O'Hagin | ................... | F24F 7/02 454/366 |
| 6,365,826 B1 * | 4/2002 | Stendardo et al. | ...... | 174/17 VA |
| 6,749,498 B2 * | 6/2004 | Pfister | ................... | 454/184 |
| 7,385,137 B2 * | 6/2008 | Burke | ................ | G02B 6/4451 174/37 |
| 7,422,273 B2 * | 9/2008 | Varga | ................... | B60J 7/1642 296/210 |
| 7,604,534 B2 * | 10/2009 | Hill | ................... | H05K 7/20618 361/679.46 |
| 2006/0000628 A1 * | 1/2006 | Lee | ................... | H02G 9/10 174/17 VA |

(Continued)

*Primary Examiner* — Steven B McAllister
*Assistant Examiner* — Jonathan Cotov (57) ABSTRACT

The present invention relates generally to outdoor enclosures. More particularly, the invention encompasses passive ventilation for an outdoor electrical enclosure. The present invention is also directed to a novel passive ventilation apparatus that is secured to an outdoor electrical enclosure. The novel passive ventilation apparatus has at least one vent or opening or gap to allow for the ventilation of air, moisture, humidity, and other fluids from an outdoor electrical enclosure. The outdoor electrical enclosure also has at least one venting means to vent air, moisture, humidity, or other fluids from inside the outdoor electrical enclosure. The outdoor electrical enclosure also has at least one means to prevent any debris from falling inside the outdoor electrical enclosure.

20 Claims, 4 Drawing Sheets

(56) References Cited

U.S. PATENT DOCUMENTS

| | | | |
|---|---|---|---|
| 2006/0199527 A1* | 9/2006 | Peters | F24F 7/02 454/347 |
| 2007/0024094 A1 | 2/2007 | Varga | |
| 2007/0097604 A1* | 5/2007 | Bruski | H02B 1/56 361/605 |
| 2008/0041624 A1 | 2/2008 | Matsumoto | |
| 2010/0184366 A1* | 7/2010 | Hassenstab | F24F 13/20 454/367 |
| 2012/0281360 A1* | 11/2012 | Nicol | H05K 7/20127 361/704 |

\* cited by examiner

PASSIVE VENTILATION FOR OUTDOOR ELECTRICAL ENCLOSURES

CROSS-REFERENCE TO RELATED APPLICATION

The instant patent application claims priority to and the benefit of U.S. Provisional Patent Application Ser. No. 61/099,280, filed on Sep. 23, 2008, titled "Passive Ventilation For Outdoor Electrical Enclosures," the entire disclosure of which provisional application is incorporated herein by reference.

FIELD OF THE INVENTION

The present invention relates generally to outdoor enclosures; More particularly, the invention encompasses passive ventilation for an outdoor electrical enclosure. The present invention is also directed to a novel passive ventilation apparatus that is secured to an outdoor electrical enclosure. The novel passive ventilation apparatus has at least one vent or opening or gap to allow for the ventilation of air, moisture, humidity, and other fluids from an outdoor electrical enclosure. The outdoor electrical enclosure also has at least one venting means to vent air, moisture, humidity, or other fluids from inside the outdoor electrical enclosure. The outdoor electrical enclosure also has at least one means to prevent any debris from falling inside the outdoor electrical enclosure.

BACKGROUND INFORMATION

Outdoor electrical and optical enclosures are used in most all houses and buildings. The outdoor electrical and optical enclosures allow for bringing the electrical and optical lines from the outdoors and then via various switches allows for the internal distribution within a building or a house. As these outdoor enclosures are usually out in the open not much attention is paid to venting these outdoor enclosures.

The accumulation of heat in an enclosure can be damaging to the contents inside the enclosure, especially, sensitive electronics. For example, overheating can shorten the life expectancy of costly electrical components or lead to catastrophic failure. This problem has been addressed for indoor enclosures by a variety of ways, such as, for example, providing static ventilation means or dynamic ventilation means. Static ventilation can be achieved by, for example, by having specifically positioning ventilation slots in an inside enclosure, or by allowing heat dissipation via radiation and convection. Whereas, dynamic ventilation can be achieved by forced air circulation via fans in a sealed indoor enclosure, or having airflow through an indoor enclosure via fans by creating a negative/positive pressure. Cooling of an indoor enclosure is also an option.

Therefore, there is a need for improvement in an outdoor electrical enclosure and in particular providing a passive ventilation system for an outdoor electrical enclosure.

U.S. Pat. No. 6,520,852 (Jim McKee, et al.), the entire disclosure of which is incorporated herein by reference, discloses a vent for venting a building enclosure having a perimeter flange having a nailing means being made of a material with a low coefficient of thermal expansion, such as for example sheet aluminum. The vent further includes a grill structure and a cap. The cap is made from dent resistant plastic to facilitate mass production and low return rates. In a preferred form of the invention the grill structure is also plastic and is molded onto the low coefficient of thermal expansion nailing means. A method of molding the grill structure onto the nailing means is also shown.

U.S. Pat. No. 6,749,498 (Steven Pfister), the entire disclosure of which is incorporated herein by reference, discloses an enclosure for providing abundant convection cooling to components placed therein while protecting the components from environmental factors external to the enclosure. Wall, roof and floor structures form a compartment for containing the components; the wall structures define openings for air passage into the compartment through a bottom opening and out of the compartment through a top opening, as internally warmed air is moved by convection through the enclosure. Louvers in the walls prevent precipitation and other external environmental elements from entering the compartment through the bottom openings. An overhang eave of the roof has a lip that extends downwardly to prevent precipitation intrusion through the top opening or openings. Screen material internally affixed to the walls covers the openings to prevent entry of insects and small animals to the inside of the compartment.

U.S. Pat. No. 6,767,281 (James H. A. McKee), the entire disclosure of which is incorporated herein by reference, discloses a passive venting device for venting enclosures comprising a base member, including an attachment portion and a vent structure for permitting gas and vapor to pass through the device; a cover member mounted to the base member so as to permit, the flow of gas and vapor to the outside; and a precipitation baffle which is sized, shaped and positioned to interfere with the entry of precipitation from the outside. The device also has a ventilation pathway spaced from the roof so as to permit thick shakes or tiles to be installed right up to the device without interfering with ventilation.

This invention improves on the deficiencies of the prior art and provides an inventive passive ventilation for an outdoor electrical enclosure.

Purposes and Summary of the Invention

The invention is a novel passive ventilation for an outdoor enclosure.

One purpose of this invention is to provide a passive ventilation system for an outdoor electrical enclosure.

Another purpose of this invention is to keep the inside of an outdoor electrical enclosure ventilated to prevent overheating.

Still, another purpose of this invention is to provide a reliable solution for venting of outdoor electrical enclosures.

Yet, another purpose of this invention is to provide a simple and a robust solution for venting of outdoor electrical enclosures.

Therefore, in one aspect this invention comprises an outdoor housing apparatus, comprising:

(a) an outdoor container having a cover, a base, and at least three walls securing said cover to said base, and forming said outdoor container having said container cover;

(b) said container cover having at least one first opening for the passage of at least one wire, and at least one second opening for the passage of at least one fluid;

(c) at least one passive ventilation apparatus is secured to at least a portion of said container cover, such that at least a portion of said passive ventilation apparatus overlaps said at least one second opening;

(d) said at least one passive ventilation apparatus comprises a top cover, at least one vertical flange secured to at least a portion of the peripheral edge of said top cover, and at least one feet secured to at least a portion of the peripheral edge of said vertical flange; and (e) wherein at least a portion of said feet is secured to at least a portion of said container cover, and thereby forming said outdoor housing apparatus.

In another aspect this invention comprises an outdoor housing apparatus, comprising:
(a) an outdoor container having a cover, a base, and at least three walls securing said cover to said base, and forming said outdoor container having said container cover;
(b) said container cover having at least one first opening for the passage of at least one wire, and at least one second opening for the passage of at least one fluid;
(c) at least one passive ventilation apparatus is secured to at least a portion of said container cover, such that at least a portion of said passive ventilation apparatus overlaps said at least one second opening;
(d) said at least one passive ventilation apparatus comprises a top cover, at least one vertical flange secured to at least a portion of the peripheral edge of said top cover, at least one horizontal flange secured to at least a portion of the peripheral edge of said at least one vertical flange, and at least one feet secured to at least a portion of the peripheral edge of said horizontal flange; and
(e) wherein at least a portion of said feet is secured to at least a portion of said container cover, and thereby forming said outdoor housing apparatus.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the drawings in which.

DETAILED DESCRIPTION

The passive ventilation of this invention comprises of an extruded-up hole in the upper end wall of the enclosure and a formed metal cover welded to the end wall. The cover overlaps with most of the height of the hole extrusion with and added gap that allows the free flow of hot air coming from the inside of the outdoor enclosure. The ventilation system allows hot air to escape easily from the outdoor enclosure while preventing water and foreign materials from getting inside the enclosure. The increased ventilation helps reduce the required size of the enclosure, and maintains the required heat rise versus ambient temperature level. Thus the enclosure size using this invention allows one to reduce the outdoor enclosure size.

As one is aware that as air temperature increases in an enclosure, the air travels towards the top of the enclosure, the enclosure has "air intakes" at the lower portion; this allows a natural flow of air from the outside through the enclosure and to the outside through the highest opening which would be the extruded hole at the top of the enclosure preventing accumulation of hot air inside the enclosure and rising heat in the components inside. This invention allows for the hottest air to be always at the top and "outside" the enclosure increasing the air flow.

Figure 1A:
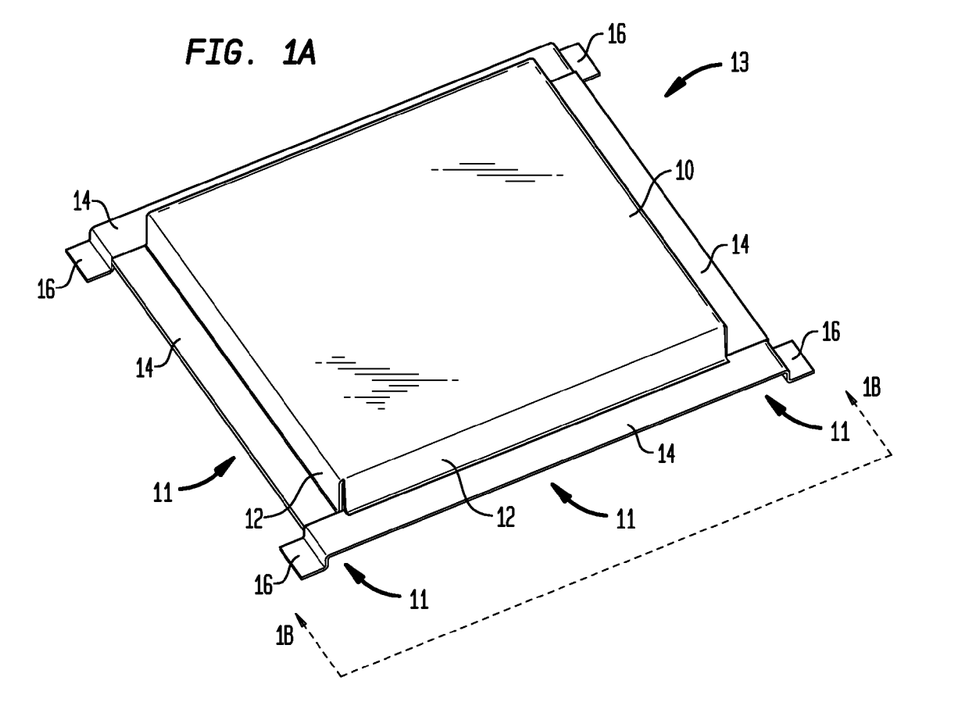
FIG. 1A illustrates a perspective view of a first embodiment of the inventive passive ventilation apparatus of this invention.

FIG. 1A illustrates a perspective view of a first embodiment of the inventive passive ventilation apparatus 13, of this invention. The inventive passive ventilation apparatus 13, comprises a top or main cover 10. The main cover 10, has at least one vertical wall or flange 12, around at least a portion of the peripheral edge of the main cover 10. It is preferred that the vertical wall or flange 12, is substantially vertical to the plane of the main cover 10, however, for some applications the vertical wall or flange 12, could have an angle of between about 30 degrees to about 150 degrees to the plane of the main cover 10, and preferably have an angle of between about 60 degrees to about 120 degrees to the plane of the main cover 10, and more preferably have an angle of between about 80 degrees to about 100 degrees to the plane of the main cover 10. Secured to at least a portion of the vertical wall or flange 12, is at least one horizontal wall or flange 14, and which is around at least a portion of the peripheral edge of the vertical wall or flange 12. It is preferred that the horizontal base or flange 14, is substantially perpendicular to the plane of the vertical wall or flange 12. However, for some applications the horizontal wall or flange 14, could have an angle of between about 30 degrees to about 150 degrees to the plane of the vertical wall or flange 12, and preferably have an angle of between about 60 degrees to about 120 degrees to the plane of the vertical wall or flange 12, and more preferably have an angle of between about 80 degrees to about 100 degrees to the plane of the vertical wall or flange 12. Secured to at least a portion of the peripheral edge of the horizontal flange 14, is at least one feet or step or flap or tab or spacer 16. Care should be taken that the feet 16, create at least a gap or opening 11, around at least a portion of the horizontal wall or flange 14.

Figure 1B:
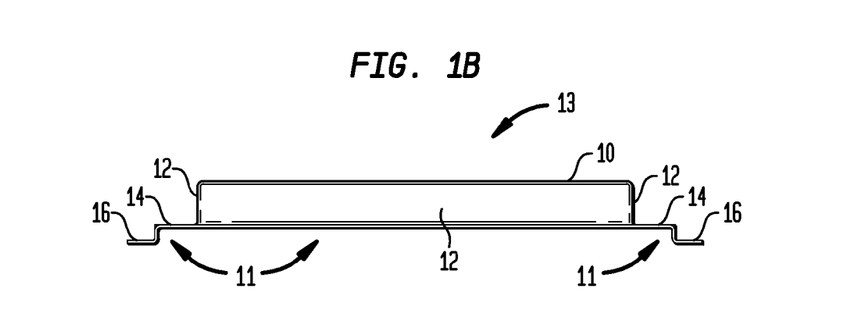
FIG. 1B illustrates a side view of the first embodiment of the inventive passive ventilation apparatus of this invention as illustrated in FIG. 1A taken along 1B-1B.

FIG. 1B illustrates a side view of the first embodiment of the inventive passive ventilation apparatus 13, of this invention as illustrated in FIG. 1A taken along 1B-1B. As one can see in FIG. 1B, that the feet 16, are positioned in such a way so at to create at least a gap or opening 11.

Figure 2A:
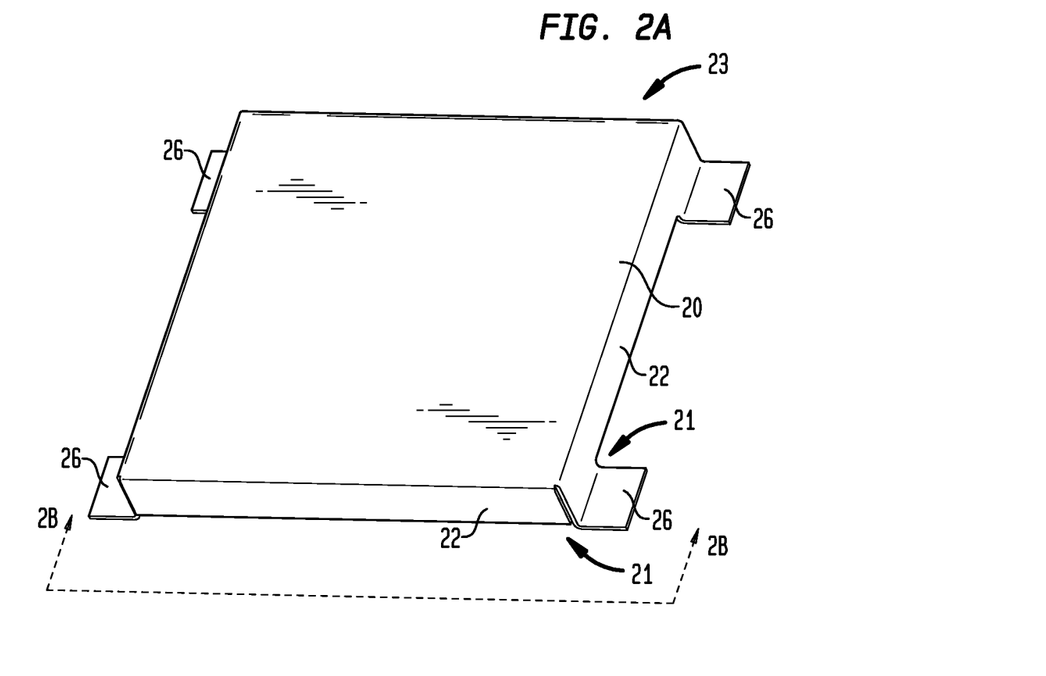
FIG. 2A illustrates a perspective view of a second embodiment of the inventive passive ventilation apparatus of this invention.

FIG. 2A illustrates a perspective view of a second embodiment of the inventive passive ventilation apparatus 23, of this invention. The inventive passive ventilation apparatus 23, comprises a top or main cover 20. The main cover 20, has at least one vertical wall or flange 22, around at least a portion of the peripheral edge of the main cover 20. It is preferred that the vertical wall or flange 22, is substantially vertical to the plane of the main cover 20, however, for some applications the vertical wall or flange 22, could have an angle of between about 30 degrees to about 150 degrees to the plane of the main cover 20, and preferably have an angle of between about 60 degrees to about 120 degrees to the plane of the main cover 10, and more preferably have an angle of between about 80 degrees to about 100 degrees to the plane of the main cover 20. Secured to at least a portion of the peripheral edge of the vertical flange 22, is at least one feet or flap or step or tab or spacer 26. Care should be taken that the feet 26, create at least a gap or opening 21, around at least a portion of the vertical wall or flange 22.

Figure 2B:
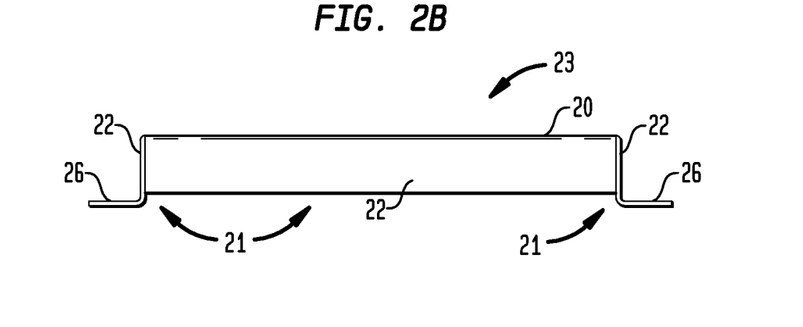
FIG. 2B illustrates a side view of the second embodiment of the inventive passive ventilation apparatus of this invention as illustrated in FIG. 2A taken along 2B-2B.

FIG. 2B illustrates a side view of the second embodiment of the inventive passive ventilation apparatus 23, of this invention as illustrated in FIG. 2A taken along 2B-2B. As one can see in FIG. 2B, that the feet 26, are positioned in such a way so at to create at least a gap or opening 21.

Figure 3A:
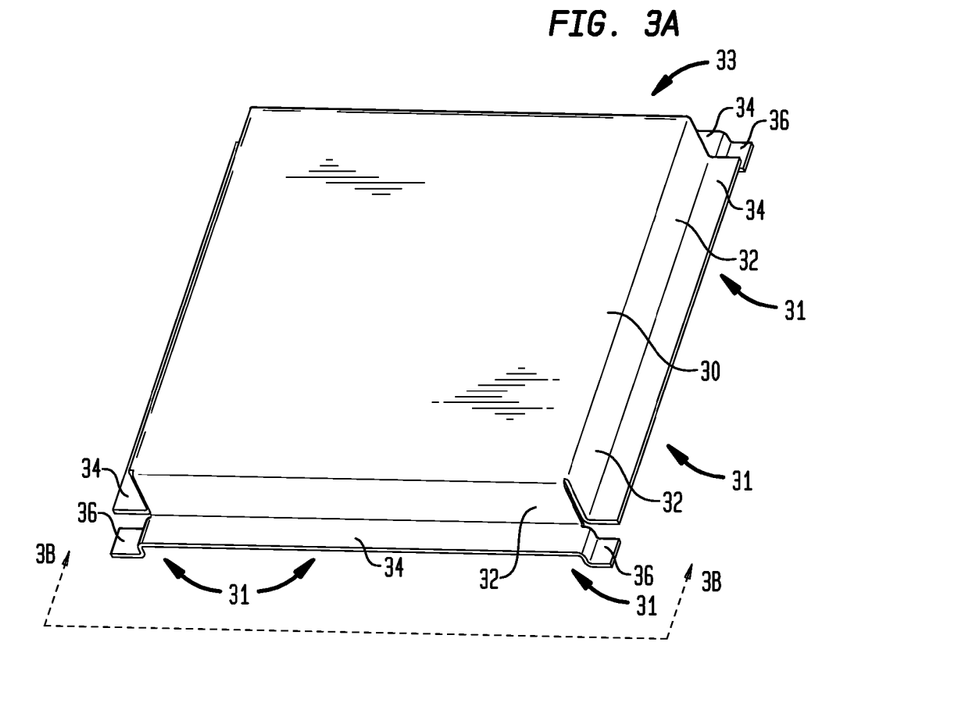
FIG. 3A illustrates a perspective view of a third embodiment of the inventive passive ventilation apparatus of this invention.

FIG. 3A illustrates a perspective view of a third embodiment of the inventive passive ventilation apparatus 33, of this invention. The inventive passive ventilation apparatus 33, comprises a top or main cover 30. The main cover 30, has at least one vertical wall or flange 32, around at least a portion of the peripheral edge of the main cover 30. It is preferred that the vertical wall or flange 32, is substantially vertical to the plane of the main cover 30, however, for some applications the vertical wall or flange 32, could have an angle of between about 30 degrees to about 150 degrees to the plane of the main cover 30, and preferably have an angle of between about 60 degrees to about 120 degrees to the plane of the main cover 30, and more preferably have an angle of between about 80 degrees to about 100 degrees to the plane of the main cover 30. Secured to at least a portion of the vertical wall or flange 32, is at least one horizontal wall or flange 34, and which is around at least a portion of the peripheral edge of the vertical wall or flange 32. It is preferred that the horizontal base or flange 34, is substantially perpendicular to the plane of the vertical wall or flange 32. However, for some applications the horizontal wall or flange 34, could have an angle of between about 30 degrees to about 150 degrees to the plane of the vertical wall or flange 32, and preferably have an angle of between about 60 degrees to about 120 degrees to the plane of the vertical wall or flange 32, and more preferably have an angle of between about 80 degrees to about 100 degrees to the plane of the vertical wall or flange 32. Secured to at least a portion of the peripheral edge of the horizontal flange 34, is at least one feet or flap or tab or step or spacer 36. Care should be taken that the feet 36, create at least a gap or opening 31, around at least a portion of the horizontal wall or flange 34.

Figure 3B:
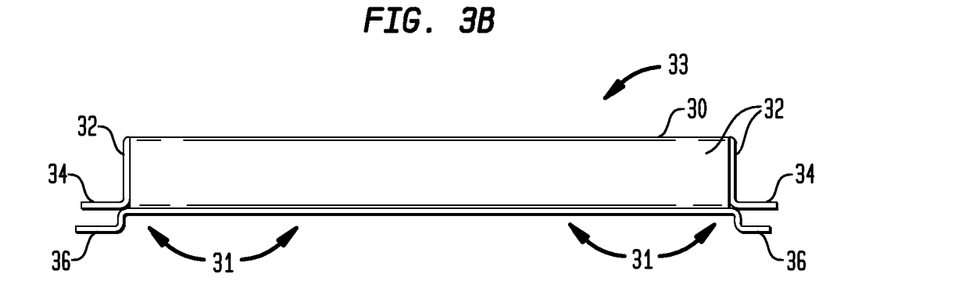
FIG. 3B illustrates a side view of the third embodiment of the inventive passive ventilation apparatus of this invention as illustrated in FIG. 3A taken along 3B-3B.

FIG. 3B illustrates a side view of the third embodiment of the inventive passive ventilation apparatus 33, of this invention as illustrated in FIG. 3A taken along 3B-3B. As one can see in FIG. 3B, that the feet 26, are positioned in such a way so at to create at least a gap or opening 31.

Figure 4A:
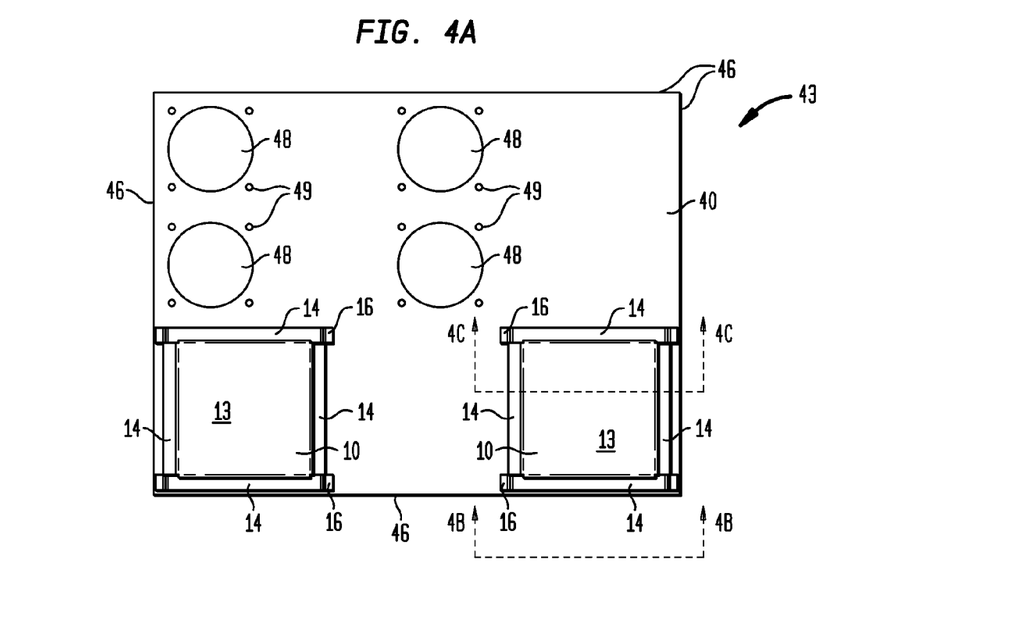
FIG. 4A illustrates a top view of an inventive outdoor electrical housing having the inventive passive ventilation apparatus of this invention.

FIG. 4A illustrates a top view of an inventive outdoor electrical housing 43, having the inventive passive ventilation apparatus of this invention. For the purposes of illustration only the inventive passive ventilation apparatus 13, has been shown with the inventive outdoor electrical housing 43. However, it is within the realm of a person skilled in the art to use any of the other inventive passive ventilation apparatus 23, 33, with the inventive outdoor electrical housing 43. The inventive outdoor electrical housing 43, is basically a container comprising a base (not shown), a main cover or panel 40, and at least three walls 46, that secure the base to the main cover or panel 40. The cover or panel 40, has at least one hole or opening 48, for the passage of at least one wire (not shown). The wire could be an electrical wire, an optical wire or a fiber optic wire. It is preferred that an electrical conduit (not shown), such as, a pvc pipe (not shown) covers the hole or opening 48, from the environmental elements and the electrical conduit is then secured to the cover or panel 40, using at least one securing means (not shown) to at least one securing location 49, such as, a hole or opening 49, for a screw or a bolt (not shown). For some applications one could even secure the electrical conduit protecting the hole or opening 48, to the securing location 49, using for example, welding means. The cover or panel 40, preferably has a vertical panel or wall or lip or return flange 46, as more clearly shown in FIG. 4B.

Figure 4B:
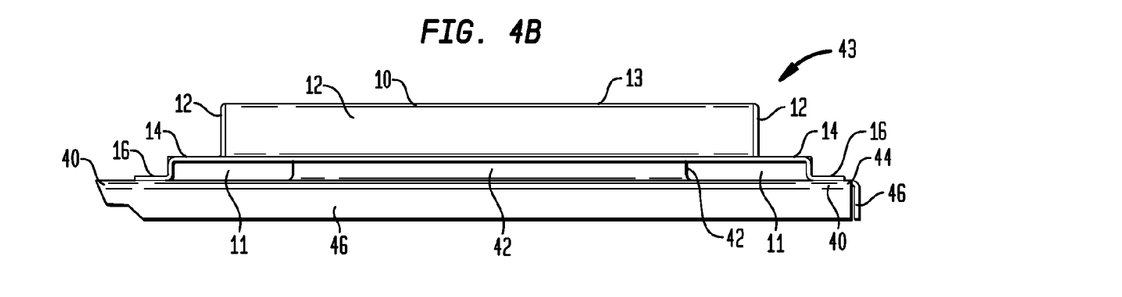
FIG. 4B illustrates a side view of the inventive outdoor electrical housing having the inventive passive ventilation apparatus of this invention as illustrated in FIG. 4A taken along 4B-4B.

FIG. 4B illustrates a side view of the inventive outdoor electrical housing 43, having the inventive passive ventilation apparatus 10, of this invention as illustrated in FIG. 4A taken along 4B-4B. As one can see that the feet 16, of the inventive passive ventilation apparatus 10, have been secured to the cover or panel 40, using securing means, such as, welding. The cover or panel 40, preferably has a vertical panel or lip or return flange 46, that is secured to at least a portion of the outdoor electrical enclosure 43, using securing means 44, such as, for example, welding. The inventive outdoor electrical housing 43, has at least one second opening 41, more clearly shown in FIG. 4C, for the venting and circulation of air. It is preferred that the peripheral edge of the second opening 41, has a collar or extruded wall 42, so as to prevent any debris from the cover or panel 40, from falling inside the inventive outdoor electrical housing 43.

Figure 4C:
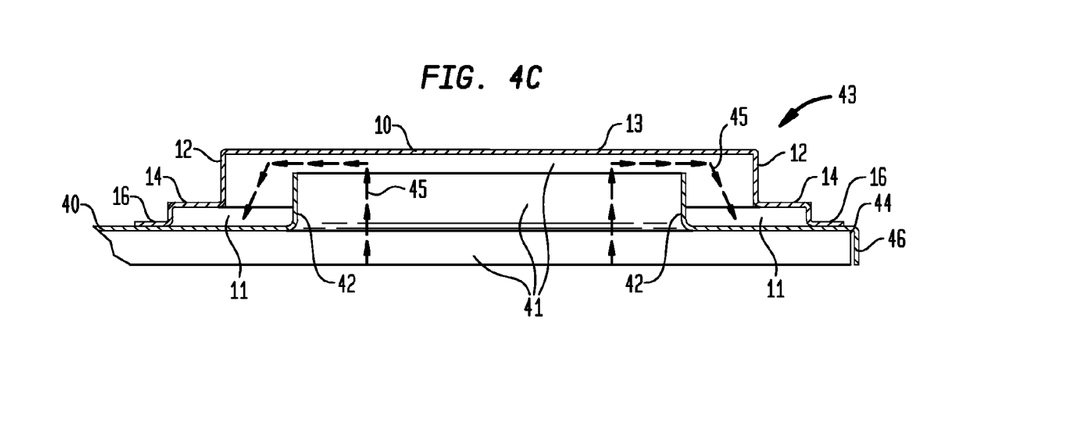
FIG. 4C illustrates a cut-away view of the inventive outdoor electrical housing having the inventive passive ventilation apparatus of this invention as illustrated in FIG. 4A taken along 4C-4C.

FIG. 4C illustrates a cut-away view of the outdoor electrical housing 43, having the inventive passive ventilation apparatus 10, of this invention as illustrated in FIG. 4A taken along 4C-4C. As one can see that the second vent opening 41, allows air to move up around the collar 42, and to the bottom of the cover 10, and out into the environment via side vent or opening 11, as shown using arrows 45.

It is preferred that the inventive passive ventilation apparatus 13, 23, 33, is made from a material selected from a group comprising a metallic material, an aluminum material, a composite material, a plastic material, a glass material, a fire resistant material, to name a few.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An outdoor electrical housing apparatus, comprising:
   (a) an outdoor container having a cover, a base, and at least three walls securing said cover to said base, and forming said outdoor container having said container cover;
   (b) said container cover having a top surface and at least one first opening for the passage of at least one wire, and at least one second opening for the passage of at least one fluid in a first direction;
   (c) at least one passive ventilation apparatus is secured to at least a portion of said container cover, such that at least a portion of said passive ventilation apparatus overlaps said at least one second opening;
   (d) said at least one passive ventilation apparatus comprises a top cover, at least one vertical flange secured to at least a portion of the peripheral edge of said top cover, a horizontal flange extending outwardly from said vertical flange and at least one feet secured underneath at least a portion of said horizontal flange extending outwardly to provide a side opening beneath said top cover wherein the side opening enables venting of fluid from within the outdoor housing apparatus to atmosphere in a second direction transverse to the first direction, wherein the at least one feet secured to at least a portion of the peripheral edge of said horizontal flange and wherein the peripheral edge of said horizontal flange extends outwardly substantially parallel to the at least one feet about up to the peripheral edge of the at least one feet to define the side opening as a straight flat gap between said horizontal flange and the cover of the outdoor container to enable a free flow of hot air coming from the inside of the outdoor container;

(e) wherein said horizontal flange extending away from said at least one second opening wherein said horizontal flange extends past a vertical plane of the side opening to form an overhang above the side opening to protect the side opening from environmental conditions; and (f) wherein at least a portion of said feet is secured to at least a portion of said top surface of said container cover, and thereby forming said outdoor housing apparatus.

2. The outdoor housing apparatus of claim 1, wherein said at least one passive ventilation apparatus completely overlaps said at least one second opening.

3. The outdoor housing apparatus of claim 1, wherein said at least one fluid is selected from a group consisting of air, moisture and humidity.

4. The outdoor housing apparatus of claim 1, wherein said at least one passive ventilation apparatus is made from a material selected from a group consisting of a metallic material, an aluminum material, a composite material, a plastic material, a glass material, and a fire resistant material.

5. The outdoor housing apparatus of claim 1, wherein said outdoor container is made from a material selected from a group consisting of a metallic material, an aluminum material, a composite material, a plastic material, a glass material, and a fire resistant material.

6. The outdoor housing apparatus of claim 1, wherein said outdoor housing apparatus is made from a material selected from a group consisting of a metallic material, an aluminum material, a composite material, a plastic material, a glass material, and a fire resistant material.

7. The outdoor housing apparatus of claim 1, wherein said at least one feet is secured to said container cover using at least one securing means.

8. The outdoor housing apparatus of claim 1, wherein said at least one feet is secured to said container cover using at least one securing means, and wherein said at least one securing means is selected from a group consisting of welding, screws, and bolts.

9. The outdoor housing apparatus of claim 1, wherein there is at least one ventilation opening between said container cover and said at least one passive ventilation apparatus.

10. The outdoor housing apparatus of claim 1, wherein said at least one horizontal flange is secured to the peripheral edge of said at least one vertical flange.

11. The outdoor housing apparatus of claim 1, wherein said at least one horizontal flange is secured to the peripheral edge of said at least one vertical flange, and wherein said at least one feet is secured to at least a portion of the peripheral edge of said at least one horizontal flange.

12. The outdoor housing apparatus of claim 1, wherein at least one collar is secured to said container cover forming said at least one second opening.

13. The outdoor housing apparatus of claim 1, wherein at least one collar is secured to said container cover forming said at least one second opening, and wherein said at least one passive ventilation apparatus overlaps said at least one collar.

14. The outdoor housing apparatus of claim 1, wherein at least one collar is secured to said container cover forming said at least one second opening, and wherein at least a portion of said at least one collar penetrates the plane formed by said at least one feet of said at least one passive ventilation apparatus.

15. The outdoor housing apparatus of claim 1, wherein at least one collar is secured to said container cover forming said at least one second opening, and wherein at least a portion of said at least one collar penetrates the plane formed by said horizontal flange of said at least one passive ventilation apparatus.

16. The outdoor housing apparatus of claim 1, wherein at least one pipe is secured to said at least one first opening.

17. The outdoor housing apparatus of claim 1, wherein said at least one wire is selected from a group consisting of an electrical wire, an optical wire, and a fiber-optic wire.

18. The outdoor housing apparatus of claim 1, wherein said vertical flange makes an angle with the plane of said top cover, and wherein said angle is selected from a group consisting of an angle of between about 30 degrees to about 150 degrees, and preferably an angle of between about 60 degrees to about 120 degrees, and more preferably an angle of between about 80 degrees to about 100 degrees.

19. The outdoor housing apparatus of claim 1, wherein said horizontal flange makes an angle with the plane of said vertical flange, and wherein said angle is selected from a group consisting of an angle of between about 30 degrees to about 150 degrees, and preferably an angle of between about 60 degrees to about 120 degrees, and more preferably an angle of between about 80 degrees to about 100 degrees, and wherein said at least one feet is secured to at least a portion of the peripheral edge of said at least one horizontal flange.

20. An outdoor electrical housing apparatus, comprising:
(a) an outdoor container having a cover, a base, and at least three walls securing said cover to said base, and forming said outdoor container having said container cover;
(b) said container cover having a top surface and having at least one first opening for the passage of at least one wire, and at least one second opening for the passage of at least one fluid in a first direction;
(c) at least one passive ventilation apparatus is secured to at least a portion of said container cover, such that at least a portion of said passive ventilation apparatus overlaps said at least one second opening;
(d) said at least one passive ventilation apparatus comprises a top cover, at least one vertical flange secured to at least a portion of the peripheral edge of said top cover, at least one horizontal flange secured to at least a portion of the peripheral edge of said at least one vertical flange, and at least one feet secured at least a portion of the peripheral edge of said horizontal flange extending downward to provide a side opening beneath said portion of the peripheral edge wherein the side opening enables venting of fluid from within the outdoor housing apparatus to atmosphere is a second direction transverse to the first direction and wherein said horizontal flange extends outwardly past a vertical plane of the side opening to form an overhang above the side opening to protect the side opening from environmental conditions wherein said horizontal flange extending away from said at least one second opening, wherein the at least one feet secured to at least a portion of the peripheral edge of said horizontal flange and wherein the peripheral edge of said horizontal flange extends outwardly substantially parallel to the at least one feet about up to the peripheral edge of the at least one feet to define the side opening as a straight flat gap between said horizontal flange and the cover of the outdoor container to enable a free flow of hot air coming from the inside of the outdoor container; and (e) wherein at least a portion of said feet is secured to at least a portion of said top surface of said container cover, and thereby forming said outdoor housing apparatus.

* * * * *